(12) United States Patent
Terasaki et al.

(10) Patent No.: US 7,981,304 B2
(45) Date of Patent: Jul. 19, 2011

(54) PROCESS FOR PRODUCING A CHIP USING A MOLD

(75) Inventors: Atsunori Terasaki, Kawasaki (JP); Junichi Seki, Yokohama (JP); Nobuhito Suehira, Kawasaki (JP); Hideki Ina, Tokyo (JP); Shingo Okushima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 327 days.

(21) Appl. No.: 12/388,179

(22) Filed: Feb. 18, 2009

(65) Prior Publication Data
US 2009/0152239 A1    Jun. 18, 2009

Related U.S. Application Data

(62) Division of application No. 11/468,876, filed on Aug. 31, 2006, now Pat. No. 7,510,388.

(30) Foreign Application Priority Data

Sep. 6, 2005    (JP) .................................. 2005-258034
Jul. 14, 2006   (JP) .................................. 2006-194905

(51) Int. Cl.
    *C03C 15/00*    (2006.01)
(52) U.S. Cl. .......................................... 216/41; 264/401
(58) Field of Classification Search .................. None
    See application file for complete search history.

(56) References Cited

U.S. PATENT DOCUMENTS

| | | | |
|---|---|---|---|
| 5,772,905 A | 6/1998 | Chou | |
| 5,838,653 A * | 11/1998 | Fan et al. | 369/275.1 |
| 6,334,960 B1 | 1/2002 | Willson et al. | |
| 6,696,220 B2 | 2/2004 | Bailey et al. | |
| 6,719,915 B2 | 4/2004 | Willson et al. | |
| 6,916,511 B2 | 7/2005 | Lee et al. | |
| 7,037,639 B2 | 5/2006 | Voisin | |
| 7,070,405 B2 * | 7/2006 | Sreenivasan et al. | 425/174.4 |
| 2003/0170053 A1 | 9/2003 | Montelius et al. | |
| 2003/0205658 A1 | 11/2003 | Voisin | |
| 2004/0008334 A1 | 1/2004 | Sreenivasan et al. | |
| 2004/0115568 A1 | 6/2004 | Schmidt | |

(Continued)

FOREIGN PATENT DOCUMENTS

JP    2000-323461 A    11/2000
JP    2003-272998 A    9/2003

(Continued)

OTHER PUBLICATIONS

Michael J. O'Leary, et al, Characterization of reactively evaporated SIOx thin films, 1987, J. Vac. Sci. Technol.Jan./Feb. A 5(1), p. 106-109.*

(Continued)

*Primary Examiner* — Binh X Tran
*Assistant Examiner* — David A Cathey, Jr.
(74) *Attorney, Agent, or Firm* — Fitzpatrick, Cella, Harper & Scinto

(57) ABSTRACT

A mold capable of a highly accurate alignment with a member to be processed in such a state that a photocurable resin material is disposed between the mold and the member to be processed, and is constituted by a substrate 2010 formed of a first material and an alignment mark 2102 formed of a second material different from the first material. The first material and the second material have transmissivities to light in a part of an ultraviolet wavelength range. The second material has a refractive index of not less than 1.7.

5 Claims, 10 Drawing Sheets

U.S. PATENT DOCUMENTS

| | | |
|---|---|---|
| 2004/0141168 A1 | 7/2004 | Sreenivasan et al. |
| 2005/0064344 A1 | 3/2005 | Bailey et al. |
| 2005/0067379 A1 | 3/2005 | Sreenivasan et al. |
| 2007/0090574 A1 | 4/2007 | Terasaki et al. |

FOREIGN PATENT DOCUMENTS

| | | |
|---|---|---|
| JP | 2004-148494 A | 5/2004 |
| JP | 2004-200664 A | 7/2004 |
| WO | 2005/040932 A2 | 5/2005 |

OTHER PUBLICATIONS

S.M.A. Durrani et al., "Characterization of Thin Films of a-SiOx (1.1 < x < 2.0) Prepared by Reactive Evaporation of SiO," 15 J. Phys.: Condens. Matter 8123-35 (2003).

Michael J. O'Leary et al., "Characterization of Reactively Evaporated SiOx Thin Films," 5(1) J. Vac. Sci. Technol. A 106-09 (Jan./Feb. 1987).

* cited by examiner

PROCESS FOR PRODUCING A CHIP USING A MOLD

This Application is a division of application Ser. No. 11/468,876, filed Aug. 31, 2006, now U.S. Pat. No. 7,510,388, which is incorporated herein by reference.

FIELD OF THE INVENTION AND RELATED ART

The present invention relates to a mold, an imprint method using the mold, and a process for producing a chip by using the mold.

In recent years, fine-processing technology for transferring a fine structure on a mold onto a member to be processed, such as a resin material or a metal material, under pressure has been developed and has received attention. This technology is called nanoimprinting or nanoembossing and has a dissolution on the order of several nanometers. Therefore, there are growing expectations that it will become the next-generation semiconductor fabrication technology to be used in place of a light exposure apparatus, such as a stepper or a scanner.

The technology can permit simultaneous processing of a three-dimensional structure on a wafer, so that it is expected to be applied to the following production technologies other than the semiconductor fabrication technology. For example, the technology is expected to be applied to various fields of production technologies including those of optical devices, such as photonic crystal, and those of a biochip, such as a micro total analysis system (μ-TAS).

In the case where such an imprint method is applied to the semiconductor fabrication technology as described in, e.g., Stephan Y. Chou et al., Appl. Phys. Lett., Vol. 67, Issue 21, pp. 3114-3116 (1995), the imprint method is performed in the following manner. A work or workpiece constituted by disposing a layer of a photocurable resin material on a substrate (e.g., a semiconductor wafer) is prepared. A mold having a processing surface (surface to be processed), on which a desired imprint pattern having projections and recesses is formed, is pressed against the work, followed by further pressure application and irradiation with ultraviolet light (ultraviolet rays) to cure the photocurable resin material. In this manner, the pattern is transferred onto the resin layer, so that the resin layer is used as a mask to effect etching, thus performing pattern formation on the semiconductor wafer.

In the above-described imprint technology, alignment (positional adjustment) of the mold with the work during the transfer of the imprint pattern of the mold is an important factor.

Japanese Laid-Open Patent Application 2000-323461 discloses the following alignment method. A mark for positional reference is provided on a light-transmissive mold substrate and a mark corresponding thereto is provided on a work. By using these marks the work is aligned. It is possible to align the mold with the work by passing light through the mold substrate from above and observing the mark on the mold substrate and the mark on the work at the same time.

However, as a result of a study carried out by the inventors, the above-described alignment method has the following problem.

When a mold having a light-transmissive alignment structure and a photocurable resin material contact each other, the alignment structure is unclear or is blurred due to a small refractive index difference between the alignment structure and the photocurable resin material.

More specifically, the photocurable resin material used for the imprint technology generally has a refractive index of approximately 1.5. On the other hand, the mold itself is generally formed of quartz having a refractive index of appropriately 1.45. Accordingly, the difference in refractive index between the materials for the mold and the photocurable resin material is small, so that even when projections and recesses for an alignment structure are provided on the mold surface by processing the mold, the alignment structure is not readily visually recognized due to its contact with the photocurable resin material. In this case, it is possible that alignment can be affected depending on a required accuracy for alignment even when the projections and recess for the alignment structure are somewhat visually recognized.

However, the alignment must be reliable and highly accurate.

SUMMARY OF THE INVENTION

An object of the present invention is to provide a mold suitable for high-accuracy alignment.

Another object of the present invention is to provide an imprint method using the mold.

A further object of the present invention is to provide a production process of a chip in which the mold is used.

According to a first aspect of the present invention, there is provided a mold comprising:

a substrate comprising a first material; and an alignment mark, disposed on the substrate, comprising a second material different from the first material;

wherein the first material and the second material have transmissivities to at least light in a part of an ultraviolet wavelength range, and wherein the second material has a refractive index of not less than 1.7.

According to a second aspect of the present invention, there is provided an imprint method comprising:

interposing a photocurable resin material between a mold as recited above and a member, to be processed, having an alignment mark; and effecting alignment control of the alignment marks and the member to be processed while detecting the alignment mark of the mold and the alignment mark of the member to be processed.

According to a third aspect of the present invention, there is provided a process for producing a chip, comprising:

preparing a mold as recited above and a member, to be processed, on which a photocurable resin material is disposed;

forming a pattern on the photocurable resin material with the mold; and etching an area contacting a layer, in which the pattern is formed, by using the pattern as a mask.

According to a fourth aspect of the present invention, there is provided a mold comprising:

a substrate comprising a first material;

a plurality of projections comprising a first layer comprising a second material different from the first material; and a second layer, comprising the second material, disposed between the projections, wherein the first material and the second material have transmissivities to at least light in a part of the ultraviolet wavelength range, wherein the second material has a refractive index of not less than 1.7, and wherein the first layer and the second layer have different thicknesses.

According to a fifth aspect of the present invention, there is provided a mold comprising:

a substrate comprising a first material; and a plurality of projections, which are disposed on the substrate, comprising a first layer comprising a second material;

wherein the first material and the second material have transmissivities to at least light in a part of the ultraviolet wavelength range, wherein the second material has a refractive index of not less than 1.7, and wherein the second material is not disposed between the projections on the substrate.

According to a sixth aspect of the present invention, there is provided a mold comprising:

an alignment mark area; and an imprint pattern area;

wherein a material having a refractive index of not less than 1.7 is disposed in the alignment mark area.

According to other aspects of the present invention, there are provided a mold, a process for producing the mold, a pressure processing method, and a pressure processing apparatus described below.

More specifically, the mold is, e.g., provided with a recess and a projection and is used for pattern formation of a layer of a photocurable resin material. The mold includes a mold substrate comprising a first material and a surface layer, which comprises a second material and constitutes at least a part of the projection. The first material and the second material are characterized by having a transmissivity to light in at least a part of the ultraviolet wavelength range and the second material is characterized by having a refractive index of not less than 1.7.

The mold according to the present invention is characterized in that an optical path length of the surface layer at the recess is different from that at the projection.

The mold of the present invention is characterized in that it has an alignment structure and at least a part of the alignment structure is constituted by the second material.

The mold of the present invention is characterized by being used in any one of production technologies of a semiconductor, an optical device including photonic crystal, and a biochip.

The process for producing the above-described mold according to the present invention is characterized by the following two steps (1) and (2):

(1) a step of forming a surface layer of the second material having a refractive index of not less than 1.7 on the mold substrate of the first material, and (2) a step of forming a desired stepped shape of the recess and the projection by etching the surface layer.

The pressure processing method of the present invention is characterized in that the above-described mold is used for pressure processing. The mold or the member to be processed is pressed and light emitted from a light source is passed through the mold to cure a photocurable resin material of the member to be processed. The mold is used during the transfer of a pattern formed on a processing surface of the mold onto the member to be processed.

Further, the pressure processing method is characterized by effecting an alignment with light in such a wavelength range that the photocurable resin material is not cured.

The pressure processing apparatus according to the present invention includes the mold and presses either the mold or the member to be processed and then cures a photocurable resin material of the member to be processed by irradiating the photocurable resin material with light emitted from a light source through the mold. The apparatus further includes a means for transferring a pattern formed on a processing surface of the mold onto the member to be processed.

Further, in the present invention, the above-described recess and projection are characterized in that they are a pattern for the alignment.

According to the present invention, it is possible to provide a mold capable of a highly accurate alignment with the work.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

First Embodiment

Mold

Figure 1:
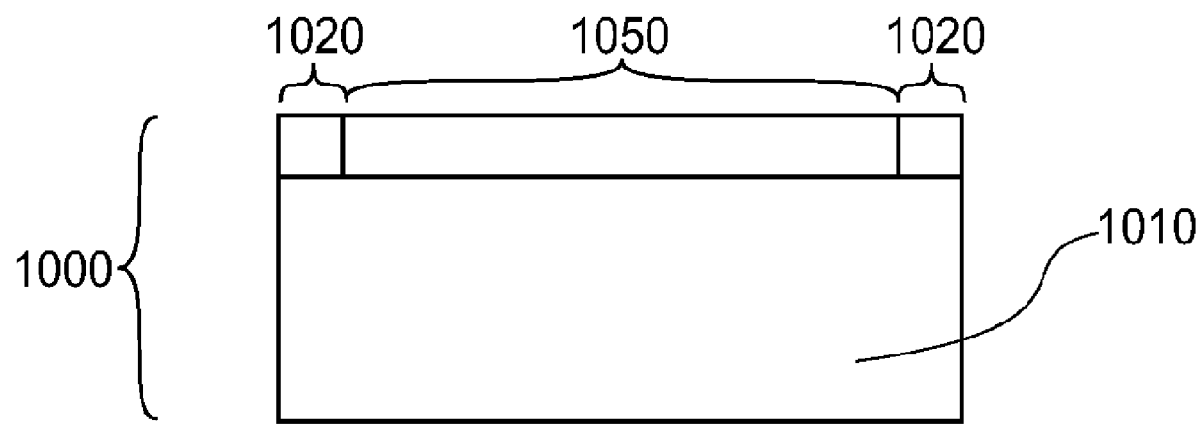
FIG. 1 is a schematic sectional view for illustrating a mold according to the present invention.

FIG. 1 is a schematic sectional view for illustrating an alignment mark provided in a mold (or a template).

Referring to FIG. 1, a mold 1000 includes a substrate (mold substrate) 1010, an alignment mark area 1020 in which an alignment mark is disposed, and a pattern area 1050 for transferring a pattern through imprint(ing). In the pattern area 1050, a pattern for imprint (e.g., a structure constituted by a recess and a projection) is actually formed, but is omitted from FIG. 1.

In this embodiment, the imprint pattern area 1050 is located at a central portion and two alignment mark areas 1020 are located at both sides of the imprint pattern area 1050, but a positional relationship therebetween is not particularly limited. For example, the alignment mark area 1020 may also be located inside the imprint pattern area 1050. Further, the number of the alignment mark areas 1020 may also be one or not less than three.

The alignment mark in this embodiment is utilized for alignment of the pattern area of the mold in an in-plane direction, i.e., an X-Y in-plane direction or adjustment of a gap between the mold and a member to be processed.

Hereinbelow, the mold (template) of this embodiment will be described with reference to FIGS. 2(a) to 2(h).

In these figures, on a substrate (mold substrate) 2010 constituted by a first material, an alignment mark 2101 constituted by a second material different from the first material. In the following description, the alignment mark 2102 is sometimes simply referred to as a member or a surface layer. The first material and the second material have transmissivities to light in at least a part of an ultraviolet wavelength range (ultraviolet rays) and the second material has a refractive index of not less than 1.7.

By using a material having a refractive index of not less than 1.7 as the second material constituting the alignment mark area of the mold, even in the case where the mold and a photocurable resin material contact each other, it is possible to effectively detect (or observe) the alignment mark of the mold. Accordingly, it is possible to perform a highly accurate alignment of the mold and the member to be processed.

In other words, according to this embodiment, by forming the surface layer (constituted by the second material) having a refractive index of not less than a predetermined value at the processing surface of the mold, it is possible to solve the conventional alignment problem that resulted from a small difference in refractive index between the mold and the member to be processed.

More specifically, by employing the material for the surface layer that has a refractive index larger than 1.7, it has been found that the alignment structures provided to the mold and the work (member to be processed) are detected based on the difference in refractive index between the material and the photocurable resin material to permit a high-accuracy alignment.

The refractive index of the surface layer in the present invention is not less than 1.7, preferably not less than 1.8, more preferably not less than 1.9. Further, the refractive index may, e.g., be not more than 3.5. However, the upper limit of the refractive index is not restricted, so long as the resultant mold is usable in the present invention.

Further, in the case where a part of the surface layer has the above-described refractive index, the surface layer may also be coated with another layer.

As described above, in this embodiment, the member 2102, as the alignment mark, formed of the second material is disposed on the substrate 2010. The member 2102 can be disposed with a variable thickness in a direction 2610 perpendicular to a thickness direction 2600. By disposing the second material in such a manner, it is possible to change an optical path length (refractive index×length of medium) in the in-plane direction 2610 of the mold in the case of causing light from the substrate 2010 side to enter the mold in the thickness direction 2600. This means that one of the recess and the projection provided in the alignment mark area can be optically observed. For example, the recess projection can be observed as a plurality of lines, dots or rings.

Figure 2:
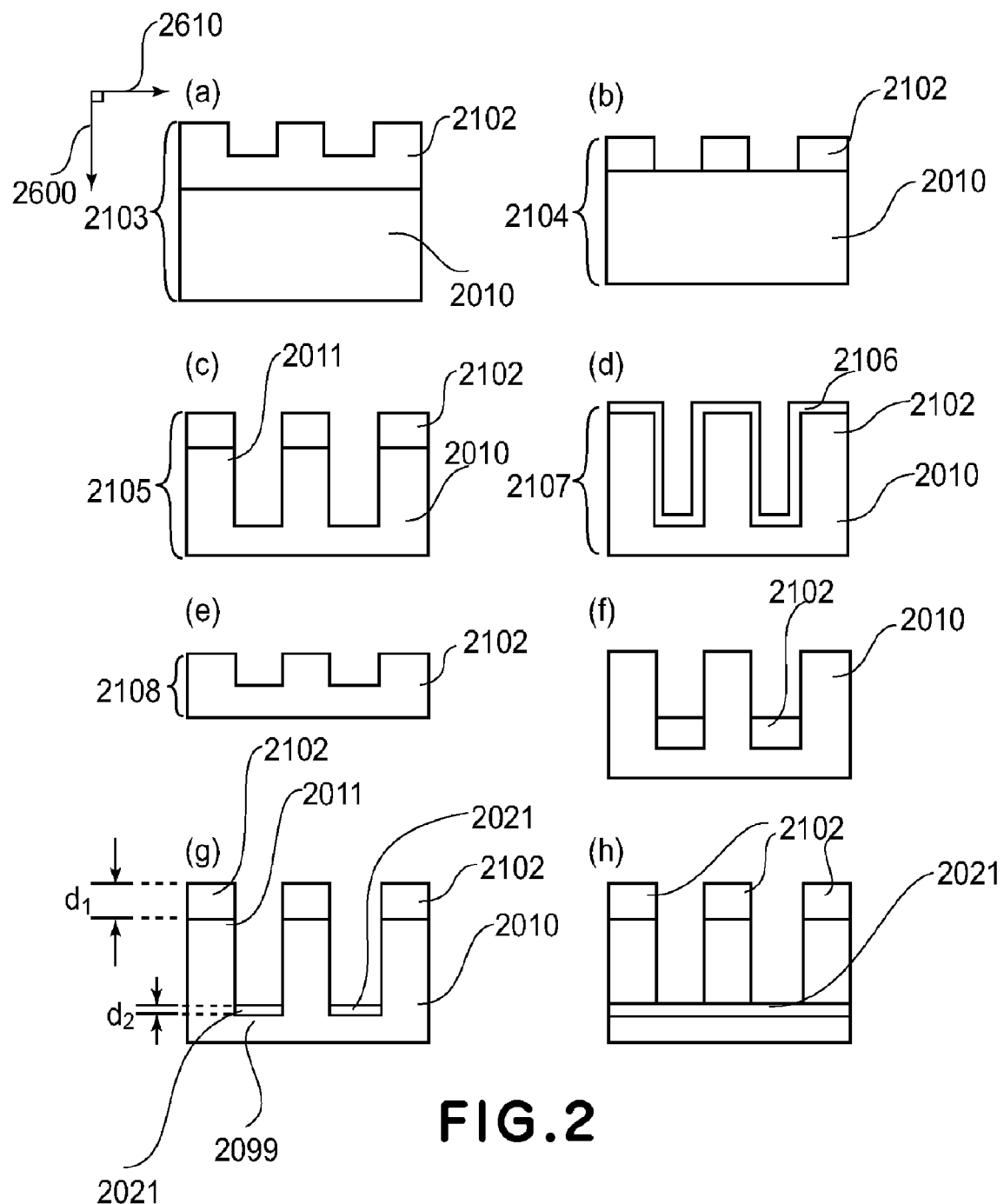
FIGS. 2(a) to 2(h) are schematic sectional views for illustrating a mold according to the present invention.

The above-described member has a first thickness and a second thickness in the direction perpendicular to the thickness direction of the mold, and the second thickness has a certain value, as shown in FIGS. 2(a), 2(e) and 2(g), or is zero, as shown in FIGS. 2(b), 2(c), 2(d) and 2(f).

In other words, the member 2102 of the second material constituting the above-described alignment mark is disposed on the mold substrate 2010 and is different in thickness at the recess and at the projection, so that the alignment mark can be observed optically. The case where the member 2102 has different thicknesses at the recess and the projection (in the direction perpendicular to the mold thickness direction), e.g., includes the case of FIG. 2(h) in which a layer of the member 2102 is provided in two layers or three or more layers to change a thickness (optical length).

Incidentally, the alignment can be effected only by clearly observing a position where the alignment mark is present. Accordingly, in such a case, the member 2102 is not necessarily required to be disposed on the substrate.

Further, when the member 2102 of the second material is viewed from above (i.e., in a top view (not shown)), the member 2102 is disposed in a shape of a plurality of lines, dots, or rings.

FIG. 2(a) shows the case where, as the alignment mark, the member 2102 having the projection constituted by the second material is disposed on a flat substrate 2010. In other words, a mold 2103 has such a structure that a stepped portion is provided by the surface layer 2102.

FIG. 2(b) shows the case where, as the alignment mark, the member 2102 constituted by the second material is disposed on the flat substrate 2010. In other words, a mold 2104 has such a structure that a stepped portion is provided to a boundary between the surface layer 2102 and the mold substrate 2. In this case, the surface layer 2102 itself constitutes the stepped portion.

FIG. 2(c) shows a case where, as the alignment mark, the member 2102 constituted by the second material is disposed on a projection 2011 of the substrate 2010 (which can also be regarded as the substrate having a recess or grooves). In other words, a mold 2105 has a stepped portion formed in a depth (height) corresponding to the sum of the thickness of the surface layer 2102 and a certain part of the thickness of the mold substrate 2101.

FIG. 2(d) shows the case where the mold shown in FIG. 2(c) is further coated with a coating material (protective layer) 2106 so as to cover the member 2102 and the substrate 2010. A mold 2107 has such a structure that a protective layer 2106 constituted by a third material is provided at the entire substrate of the mold 2105 shown in FIG. 2(c). Similarly, the protective layer may also be provided on the entire surface of the mold 2103 shown in FIG. 2(a) or the entire surface of the mold 2104 shown in FIG. 2(b). The third material may be identical to the material for the surface layer 2102, but may be selected from any materials that transmit ultraviolet light in a wavelength range in common with the mold substrate 2010 and the surface layer 2102. The third material may also be a release agent, which can be applied in order to permit a smooth release of the mold after the imprint.

FIG. 2(e) shows the case where a mold 2108 is constituted by only the member 2102 constituted by the second material.

FIG. 2(f) shows the case where, as the alignment mark, the member 2102 constituted by the second material is provided at a recess of the substrate 2010. A thickness of the member 2102 is not particularly limited, but may preferably be such a value that the member 2102 does not protrude from the uppermost surface of the substrate 2010.

FIGS. 2(g) and 2(h) show the case where, as the alignment mark, the member 2102 constituted by the second material is disposed at a recess 2099 of the substrate 2010 (FIG. 2(g)) or at both the recess 2099 and the projection 2011 of the substrate 2010 (FIG. 2(h)). A substrate 2021 disposed at the recess may be the same as or different from the substance (the second material) for the member 2102. However, the substance 2021 may preferably have a refractive index close to the refractive index of the member 2102. In this case, a thickness d1 of the member 2102 at the projection 2011 and a thickness d2 of the substance 2021 at the recess 2099 or at both the recess 2099 and the projection 2011 may preferably be different from each other. Further, from such a viewpoint that the alignment mark at the uppermost surface of the mold can be more clearly recognized visually, the thicknesses d1 and d2 may preferably be d1>d2. However, the present invention according to this embodiment is not limited to this relationship (d1>d2).

Incidentally, thicknesses of the substrate 2010 and the member 2102 are not particularly restricted, and may desirably be values capable of avoiding an unnecessary interference condition. For example, when observation light has a wavelength λ and the member 2102 has a refractive index of n, an unnecessary interference can occur to impede the desired contrast, e.g., in the following relationship:

$$\lambda/4n < (\text{thickness of member 2102}) < (\text{coherence length of observation light}).$$

When the wavelength of the observation light is 633 nm and the refractive index of the member 2102 is 1.7, λ/4n is approximately 100 nm. For this reason, the thickness of the member 2102 may desirably be not more than 100 nm or not less than the coherence length of the observation light. It is possible to similarly consider the thickness of the substrate 2010. However, strength of the mold is also taken into consideration in addition to the above interference relationship, and the thickness of the substrate 2010 may desirably be not less than several ten micrometers.

First Material and Second Material

The first material for the mold substrate 2010 and the second material for the surface layer 2102 have a transmittance capable of curing the layer of photocurable resin material provided to the work (member to be processed) with respect to the recess in at least a part of the ultraviolet wavelength range. As a result, the photocurable resin material provided to the work is cured or solidified by being irradiated with light emitted from a light source through the mold, so that it is possible to transfer the imprint pattern (having the recess and the projection) formed at the processing surface of the mold onto the work. The entire mold constituted by the first material and the second material has a transmittance, with respect to ultraviolet light (e.g., wavelength: 365 nm), of not less than 50%, preferably not less than 70%, more preferably not less than 85%.

Here, the substrate 2010, the member (surface layer) 2102, and the protective layer 2106 have transmissivities to light in at least a part of the ultraviolet wavelength range for curing at least the photocurable resin material.

Alignment of the mold with the work is effected by using light in a wavelength range in which the photocurable resin material is not cured.

Accordingly, the respective materials for the substrate 2010, the member (surface layer) 2102, and the protective layer 2106 may preferably have transmissivities to light also in a part of a wavelength range in which the photocurable resin material is not cured. It is also possible to use such a light source for alignment that an amount of light in a wavelength range for actually curing the photocurable resin material is decreased.

Further, as described above, based on the difference between the refractive index of the photocurable resin material and the refractive index of the second material, the high-accuracy alignment of the mold with the work (member to be processed) is effected by detecting the alignment structure provided with respect to the mold, so that the surface layer 2102 is required to be formed of a material different in refractive index from the photocurable resin material.

Next, a degree of transmittance of ultraviolet light and a refractive index of the surface layer 2102 in selecting the respective materials for the substrate 2010, the surface layer 2102, and the protective layer 2106 will be described.

The transmittance of ultraviolet light is required to be such a value that the photocurable resin material can be cured by irradiation of ultraviolet light from a light source when the mold is disposed between the light source and the photocurable resin material.

The photocurable resin material is basically cured by increasing an amount of exposure light unless the transmittance of the mold is zero with respect to ultraviolet light used. However, in view of actual throughput, the transmittance is required to be higher to some extent.

As the light source for use in a photocuring process, one capable of emitting light of a wavelength of, e.g., 365 nm is used. With respect to this wavelength, e.g., $SiO_2$ has a transmittance of approximately 90%.

In order not to considerably lower the throughput compared with $SiO_2$, the member (surface layer) constituted by the second material may desirably have a transmittance of at least 30%.

Further, when there is a large difference in transmittance among the substrate 2010, the surface layer 2102, and the protective layer 2106, it is possible that an irregularity in a curing state of the photocurable resin material may occur. For this reason, the transmittances of the materials for these members are preferably be closer to each other. The member (surface layer) constituted by the second material may more preferably have a transmittance of not less than 60%, further preferably not less than 80%.

Next, the refractive index will be described.

Generally, between substances having refractive indices largely different from each other, it is possible to visually recognize the structure based on refraction, reflection, or scattering at an interface therebetween. Accordingly, a contrast is more likely to occur if the refractive index of the member (surface layer 2102) is higher.

The upper limit of the refractive index is not particularly limited. Examples of refractive indices of representative dielectric members through which ultraviolet light passes may include 1.43 for calcium fluoride (typically represented by $CaF_2$), 1.45 for silica, quartz or fused silica (typically represented by $SiO_2$), 1.78 for alumina (typically represented by $Al_2O_3$), 2.0 for silicon nitride (typically represented by SiN), and approximately 2.4 for titanium oxide (typically represented by $TiO_2$). Examples of transmittances of these substances with respect to ultraviolet light of, e.g., a wavelength of approximately 365 nm may include approximately 97% for $CaF_2$, approximately 90% for $SiO_2$, approximately 80% for $Al_2O_3$, approximately 60% for $TiO_2$, and approximately 90% for SiN. When the alignment mark is capable of being optically observed, SINC or SiC is used as the second material in some cases. The refractive index of SiC is 3.1, so that the upper limit of refractive index is not less than 3.5, preferably not less than 3.0. The refractive index itself varies depending on a measurement wavelength, but the above-described data about the refractive index is that with respect to visible light (wavelength: 633 nm).

The refractive index of the second material in this embodiment of the present invention may preferably be not less than 1.7 with respect to visible light (wavelength: 633 nm). The upper limit of the refractive index is not specifically limited, but may be not less than 3.5, as described above.

In the case where the difference in the refractive index is small, in order to obtain a higher contrast in a minute structure, a difference in the optical path length is an important factor.

When a refractive index of the photocurable resin material is n1, a refractive index of the second material for the surface layer 2102 is n2, and a height (depth) of a stepped portion of the surface layer 2102 of the mold is t, the optical path length difference of light reflected by a surface of the work at the recess and the projection of the mold is obtained according to the following equation:

$$\text{Optical path length difference} = 2|n2 \times t - n1 \times t| = 2t|n2 - n1|.$$

When the wavelength of incident light is λ, the highest contrast can be ensured when the optical path difference is (½+m) λ (m: integer).

Accordingly, it is possible to obtain a maximum contrast when the following relationship is satisfied:

$$2t|2n-n1|=(½+m)\times\lambda \text{ (m: integer)}.$$

However, in the case where a difference between n1 and n2 is small and t is equal to or less than λ, there is only the case of m=0, and the left side of the equation is small in the majority of cases.

Accordingly, the following relationship is an actual index of contrast:

$$2t|n2-n1|\leq(½)\lambda.$$

As detection light, light in a wavelength range in which the photocurable resin material is not cured is used in the present invention, but light in a visible wavelength range is generally used.

For example, assuming that a light source of a single wavelength of 633 nm is used, a value of (½) λ is 316.5 nm.

Here, e.g., in the case where the mold is constituted by only SiO₂ having a refractive index of 1.45, assuming that a refractive index of the photocurable resin material is 1.5 and a depth of the mold is 150 nm, the resultant optical path length difference is 2×150 nm×|1.45−1.5|=15 nm.

This is an example in which it is difficult to actually obtain a contrast according to an experiment carried out by the inventors.

Accordingly, the optical path length difference is required to be at least 15 nm.

On the other hand, a contrast is successfully detected in an example in which a mold having a surface layer of TiO₂ (t=60 nm) is dipped into water (refractive index: 1.4).

Assuming that the refractive index of TiO₂ is 2.4, the optical path length difference in this example is 2×60 nm×(2.4−1.4)=120 nm.

From the results of the above-described examples, it can be considered that a threshold capable of permitting the observation of the contrast is in the range of 15 nm≦(optical path length difference)≦120 nm.

Here, e.g., assuming that the threshold of the optical path length difference is 60 nm, when the surface layer has a thickness of 150 nm, n2>1.7. Accordingly, in this case, in order to provide a mold capable of permitting observation of the contrast only by the recess and the projection of the surface layer, a refractive index of not less than 1.7 is required. In other words, the second material may preferably have a refractive index of not less than 1.7. This means that a refractive index difference between the surface layer and the photocurable resin material is greater than 0.2.

The optical path length difference is proportional to the product of the values of the stepped portion and the refractive index, so that the value (height or depth) of the stepped portion can be actually decreased by preparing a material having a high refractive index. On the other hand, the refractive index can be actually decreased by increasing the value of the stepped portion.

Further, when a sensitivity of a detector can be increased, it is possible to detect a contrast even in the case of a smaller difference in optical path length.

Accordingly, the refractive index of not less than 1.7 is merely one real solution, but can be such an index that it is difficult to detect the contrast when the refractive index is less than 1.7.

In view of the above description, the respective materials for the substrate 2010, the member (surface layer) 2102 constituted by the second mold, and the protective layer 2106 are selected as follows.

Examples of the material for the mold substrate 2010 constituted by the first material may include SiO₂, CaF₂ and ordinary glass and quartz.

Examples of the material for the member 2102 constituted by the second material may include SiN, TiO₂, Al₂O₃, indium tin oxide (ITO), and zinc oxide.

Examples of the material for the protective layer 2106 may include transparent dielectric materials, such as SiO₂, SiN, TiO₂, ITO, Al₂O₃, and CaF, and a release agent.

As the material for the protective layer 2106 shown in FIG. 2(d), silicon oxide may preferably be used. In this case, a layer of silicon oxide is formed as the protective layer 2106 by a coating method. This is because a release agent can be readily adhered to the mold by the presence of silicon oxide as the material for the protective layer for the surface layer of mold in such a case that a hydrophobic silane coupling agent is used as the release agent in an imprint step.

Incidentally, thicknesses of the substrate 2010 and the member 2102 are not particularly limited, but are desirably such that any unnecessary interference is avoided. For example, when observation light has a wavelength δ and the member 2102 has a refractive index of n, an unnecessary interference can occur to impede of the desired contrast, e.g., in the following relationship:

$$\delta/4n<\text{(thickness of member 2102)}<\text{(coherence length of observation light)}.$$

When the wavelength of the observation light is 633 nm and the refractive index of the member 2102 is 1.7, δ/4n is approximately 100 nm. For this reason, the thickness of the member 2102 may desirably be not more than 100 nm or not less than the coherence length of the observation light. It is possible to similarly consider the thickness of the substrate 2010. However, strength of the mold is also taken into consideration in addition to the above interference relationship, and the thickness of the substrate 2010 may desirably be not less than several ten micrometers.

Layer Structure of Alignment Mark Area and Pattern Area

In the case where the alignment mark area 1020 and the pattern area 1050 shown in FIG. 1 have the same layer structure, the same layer structure is preferable since the steps during the preparation of the mold are simplified. Further, the same layer structure may preferably lead to fewer rigidity irregularities in an in-plane direction of the mold.

It is also possible to employ different layer structures in the alignment mark area 1020 and the pattern area 1050. For example, in this case, the alignment mark area is constituted by quartz (silica or fused silica) and silicon nitride as a surface layer of the layer of quartz, and the pattern area is constituted by quartz. As a result, the process for preparing the mold is somewhat complicated, but the above case is effective when the thickness of mold is intended to be controlled. Such a constitution is particularly suitable for controlling a relatively large thickness.

Member to be Processed

The member to be processed is also called a work in some cases. Examples of the member to be processed may include a semiconductor substrate, such as an Si substrate or a GaAs substrate, a resinous substrate, a quartz substrate (silica substrate or fused silica substrate, and a glass substrate. It is also possible to use a multi-layer substrate prepared in such a manner that a thin film is grown on these substrates or bonded to these substrates. It is also possible to employ a light transmissive quartz (silica or fused silica) substrate.

The resin applied onto the substrate is cured by irradiating the substrate with, e.g., ultraviolet rays from the mold side. Example of such a photocurable resin may include those of a urethane type, an epoxy type, and an acrylic type.

Further, as the resin, it is also possible to use a thermosetting resin, such as a phenolic resin, an epoxy resin, a silicone resin, or polyimide, and a thermoplastic resin, such as polymethyl methacrylate (PMMA), polycarbonate (PC), polyethylene terephthalate (PET), or acrylic resin. By using these resins, the pattern is transferred through heat treatment as desired.

In the case where the member to be processed does not contain the resin, the member to be processed is physically deformed only by a pressing force.

The above-described members or technical features in the First Embodiment may also be applicable to all the embodiments of the present invention. Further, the entire disclosure of each one of U.S. Pat. Nos. 6,696,220; 6,719,915; 6,334,960; and 5,772,905 and U.S. patent application Ser. No. 10/221,331 is expressly incorporated herein by reference. For example, U.S. patent application Ser. No. 10/221,331 discloses that the processing member is not supported partially, but is supported at an entire back surface of the processing member. However, a movable mechanism, a member to be processed, and a holding mechanism at a mold (stamp) holding portion are applicable to the present invention.

The above-described mold according to the present invention can be applied to transfer a pattern of a recess and a projection on a nanometer to micrometer scale.

Second Embodiment

Mold

A mold according to Second Embodiment of the present invention will be described with reference to FIG. 2(g).

In the First Embodiment described above, FIG. 2(g) is the sectional view of the layer structure of the mold in the alignment mark area. However, in this embodiment, the layer structure shown in FIG. 2(g) is used without a distinction between the alignment mark area and the pattern area. This is because it is possible to appropriately determine, in some cases, whether or not a portion of an imprint pattern, having a recess and a projection, provided at a processing surface of the mold, is utilized as the alignment mark. More specifically, so long as the mold has features described below, the mold is embraced in the scope of the present invention irrespective of whether the features are provided in any area of the mold.

Referring to FIG. 2(g), the mold of this embodiment includes the substrate 2010 constituted by the first material, the plurality of recesses 2011 constituted by the first layer 2102 of the second material different from the first material, and the second layer 2021 constituted by the second material disposed between adjacent recesses 2011 on the substrate 2010.

The first material and the second material have transmissivities to light in at least a part of the ultraviolet wavelength range, and the second material has a refractive index of not less than 1.7. The thicknesses of the first layer and the second layer (d1 and d2 in FIG. 2(g)) are different from each other. By the different thicknesses d1 and d2, as described in First Embodiment, it is possible to ensure the optical path length difference. Accordingly, even in the state in which the photocurable resin material is disposed between the mold and the work, it is possible to optically observe or detect the first and second layers 2102 and 2021.

In this embodiment, the value of d2 may also be zero. Alternatively, the value of d1 may be zero and the value of d2 is a certain value as shown in FIG. 2(f).

Figure 8:
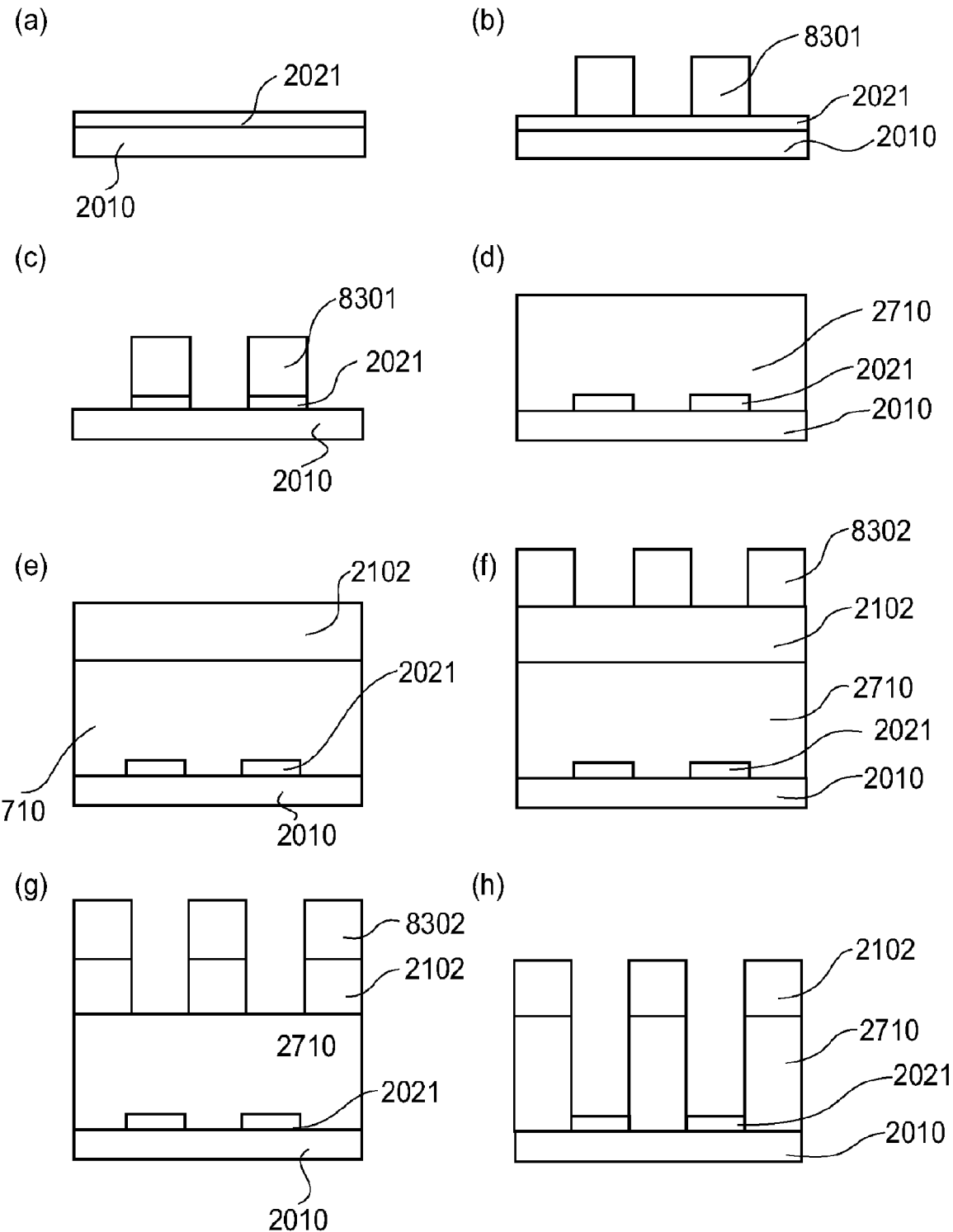

The mold shown in FIG. 2(g) is prepared, e.g., in a manner shown in FIG. 8, which will be specifically described below in Embodiment 5.

Figure 9:
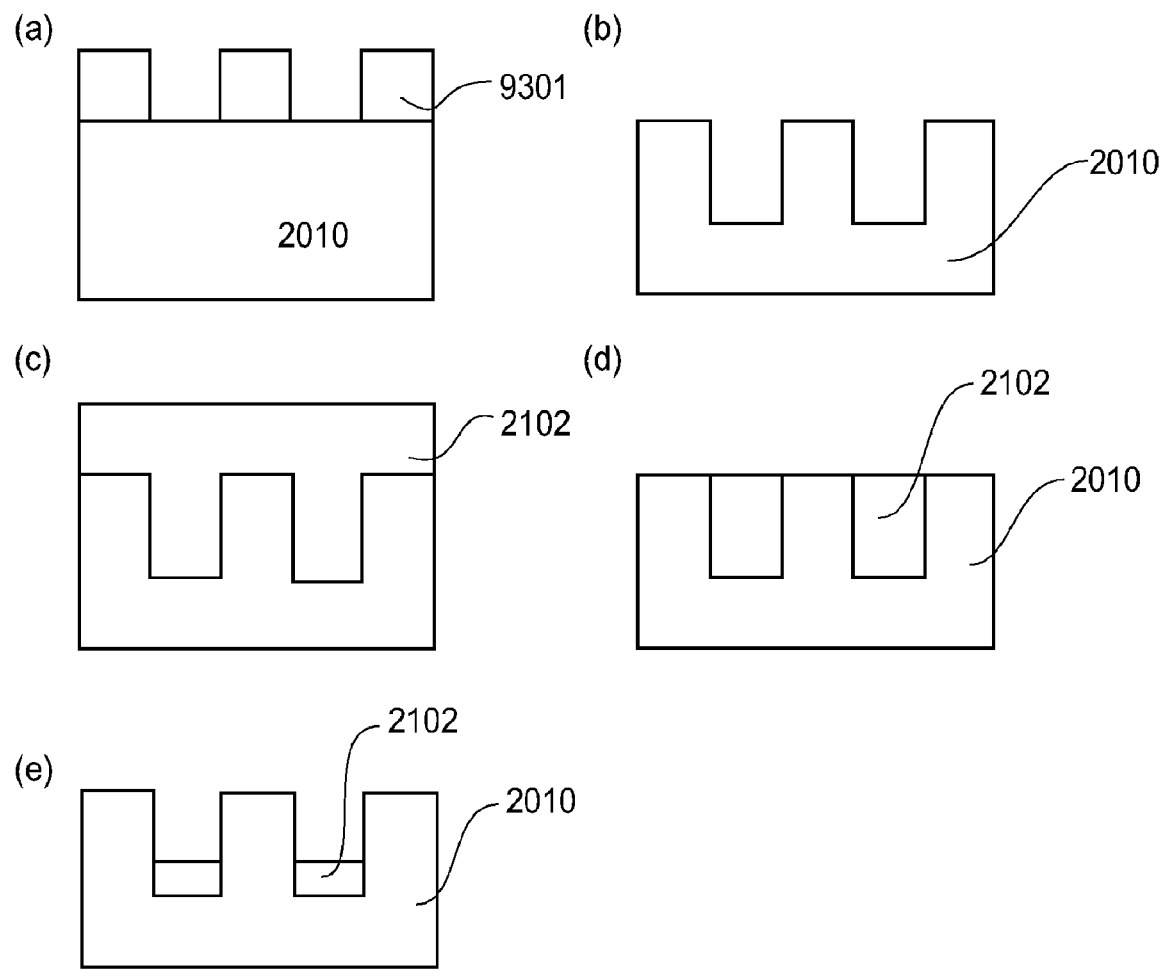

Further, the mold shown in FIG. 2(f) is prepared, e.g., in a manner shown in FIG. 9, which will be specifically described below in Embodiment 6.

The technical features described in the First Embodiment can also be applicable in the Second Embodiment, so long as they are not inconsistent.

Third Embodiment

Mold

A mold according to this embodiment will be described with reference to FIG. 1. As shown in FIG. 1, the mold includes the imprint pattern area 1050 (in which a pattern of a recess and a projection is not shown) and the alignment mark area (in which an alignment mark is not shown). As described in the First Embodiment, the positional relationship between the respective areas and the number of the alignment mark area is not particularly limited.

The material constituting the alignment mark area is a material having a refractive index of not less than 1.7 and can be selected from, e.g., silicon nitride, titanium oxide, and aluminum oxide, described above. It is not necessary to form the alignment mark area only from the above-described material.

The imprint pattern area 1050 may be formed from the same material as described above or quartz (silica or fused silica).

By employing a constitution such as described above, e.g., even in the case where the processing surface of the mold 1000 contacts the photocurable resin material, the alignment mark can be recognized at a high contrast, since the material having a high refractive index is employed in the alignment mark area. As a result, it is possible to effect alignment with a high accuracy.

Figure 11:
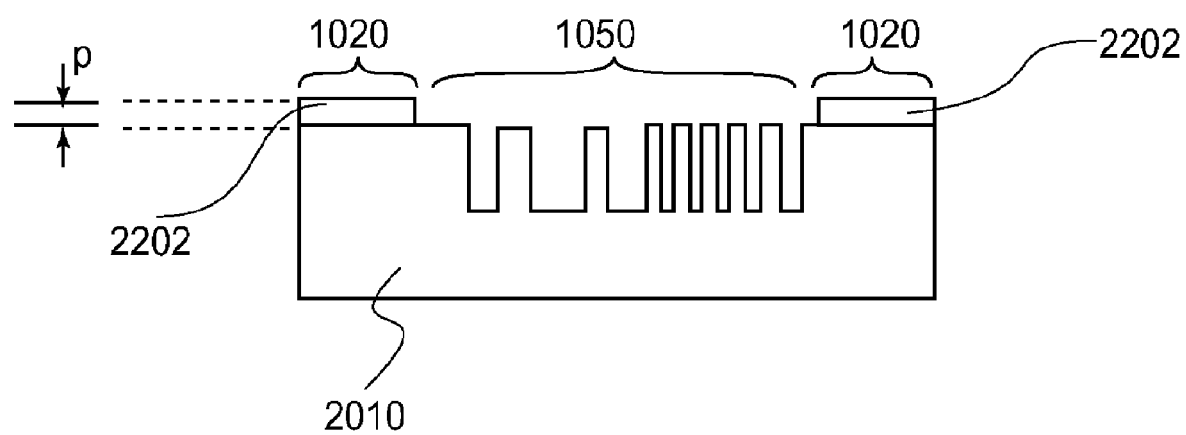
FIG. 11 is a schematic sectional view for illustrating a mold according to the present invention.

Further, in this embodiment, as shown in FIG. 11, an alignment mark area 1020 may also be disposed so that it protrudes from a level of an uppermost surface of an imprint pattern area 1050. More specifically, as shown in FIG. 11, in the alignment mark area 1020, a portion (constituting the alignment mark area) 2202 is disposed on a mold substrate 2010 so as to be protrude from the surface of the mold substrate 2010 by a thickness p. The value of the thickness p can be appropriately set in the range of not less than 1 nm and not more than 1 µm. The portion 2202 is formed of a material having a refractive index of not less than 1.7. This constitution is effective as described below.

Figure 10:
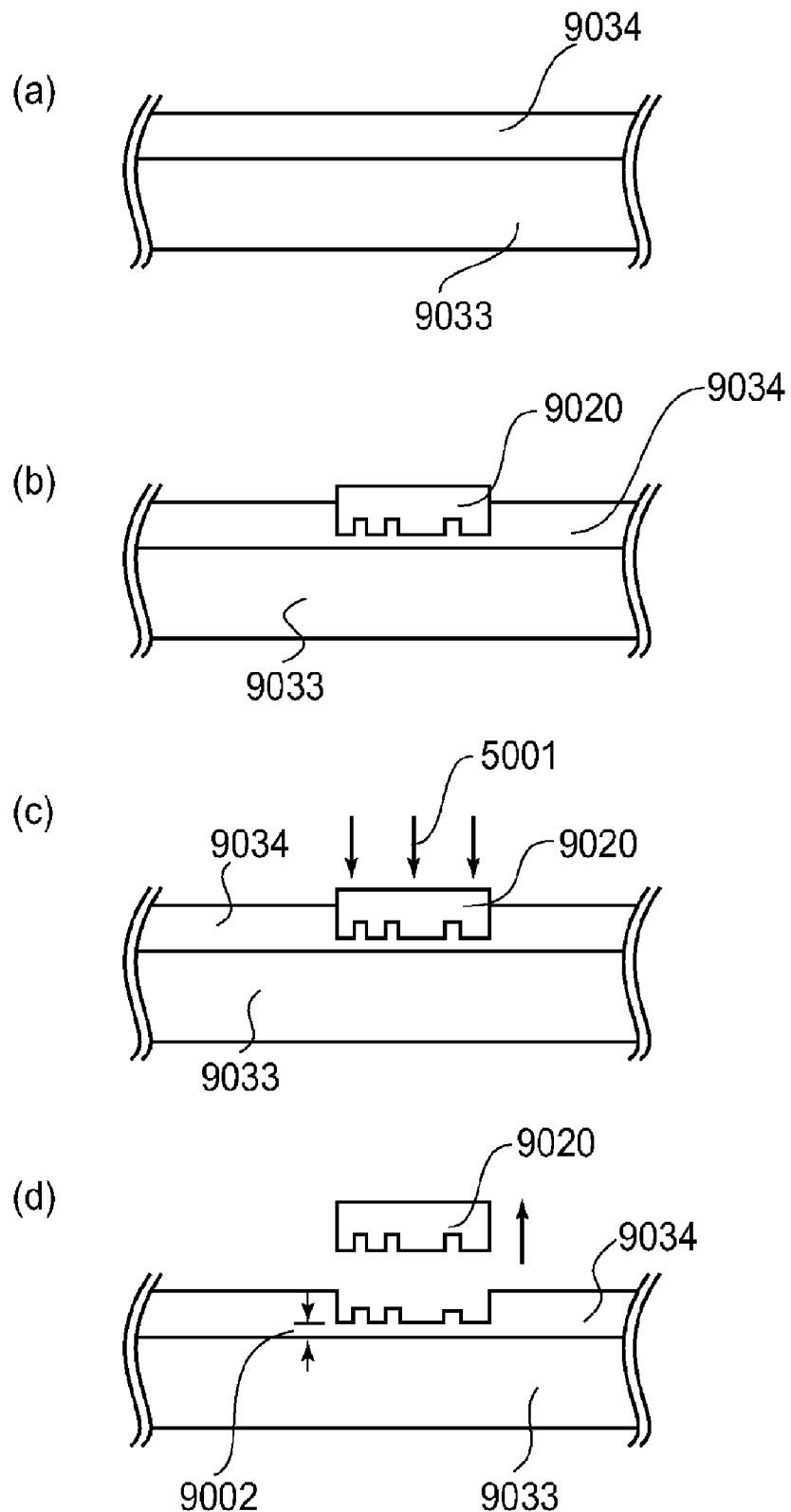
FIGS. 10(a) to 10(d) are schematic sectional views for illustrating an imprint method according to the present invention.

In an imprint method, it is important that a thickness of a residual film represented by a reference numeral 9002 shown in FIG. 10(d) be as uniform as possible. This is because the residual film portion is generally removed by, e.g., reactive ion etching, and the shape of a resinous portion that is used as a mask is nonuniform when the thickness of the residual film is nonuniform.

By employing the constitution as shown in FIG. 11 and causing the portion 1020 and a member to be processed and oppositely disposed to contact each other, it is possible to provide a uniform thickness of the residual film. In some cases, a very thin resinous layer actually remains between the portion 1020 and the member to be processed.

In this embodiment, the portion 2022 constituting the alignment mark area 1020 can also be formed from an electroconductive material with a refractive index of not less than 1.7, such as titanium oxide, at the outermost surface of the mold. In this case, a mark (of an electroconductive material) corresponding to the alignment mark of the mold side is provided on the work (member to be processed) side in advance.

By detecting the physical contact of both marks or an electrical change in a state close to the contact state, it is possible to align both the mold and the work, i.e., a positional alignment in an in-plane direction and/or a gap adjustment in a direction perpendicular to the in-plane direction. The detection of the electrical change can be realized by, e.g., such a constitution that a current flows between the mold and the work.

Fourth Embodiment

Imprint Method

An imprint method according to this embodiment employs the mold described in any one of the First to Third Embodiments. More specifically, the photocurable resin material is disposed between the mold and the member to be processed, and position control of both the mold and the member to be processed is exercised, while detecting the alignment mark provided with respect to the mold and the alignment mark provided with respect to the member to be processed.

Fifth Embodiment

Chip Production Process

A process for producing a chip according to this embodiment employs the mold described any one of the First to Third Embodiments. More specifically, the production process includes: preparing the mold and the member to be processed, forming a pattern in the photocurable resin material disposed on the member to be processed using the mold, and etching an area contacting a layer in which the pattern is formed by using the pattern as a mask. A recess is formed at an upper portion of the member to be processed in an area in which the pattern is not formed.

Hereinbelow, with reference to FIGS. 10(a) to 10(d), an example of an imprint method (imprint lithography) employed in this embodiment will be described. The example of the imprint method is that of a light imprint scheme for curing a resin material by light irradiation. However, it is also possible to cure the resin material by heating or by heating and light irradiation.

First, as shown in FIG. 10(a), a member to be processed 9033, such as a silicon substrate, having a layer of a photocurable resin material 9034 on a surface thereof and a mold 9020 (not shown in FIG. 10(d)) are disposed opposite to each other. Next, as shown in FIG. 10(b), the mold 9020 and the photocurable resin material 9034 are brought into contact with each other. In this case, they may be contacted by moving either one or both the mold and the member to be processed. Pressure is applied to these members by the contact. As a result, a shape of the photocurable resin material is changed to a shape reflecting a pattern, having a recess and a projection, of the mold. In FIG. 10(b), the mold is depicted so that it is provided with a certain imprint pattern, and an alignment mark is omitted from the figure.

When the mold described in the above Embodiments is used in this embodiment, even in the case where the mold 9020 and the photocurable resin material 9034 contact each other (in a contact state), it is possible to clearly observe the alignment mark. Accordingly, even in such a contact state, it is possible to achieve a highly accurate alignment control.

Then, as shown in FIG. 10(c), the photocurable resin material 9034 is irradiated with ultraviolet light (UV light) 5001 from the back surface side of the mold 9020, thus being cured.

Thereafter, the mold 9020 is moved away from the cured resin material 9034, as shown in FIG. 10(d). As needed, the mold or the member to be processed is moved to effect the transfer again in an area adjacent to the pattern transfer area, thus performing a step-and-repeat scheme.

As shown in FIG. 10(d), in the case where a residual film 9022 is present in the resin portion, the residual film 9002 is removed by ashing (oxygen reactive etching) as desired. As a result, the pattern of the mold is transferred onto the member to be processed (work).

Although not shown in FIGS. 10(a) to 10(d), the substrate underlying the transferred pattern (constituted by the cured resin material in the case of FIGS. 10(a) to 10(d)) used as a mask is subjected to etching. The substrate is constituted by the silicon substrate itself or a substrate on which a plurality of layers is laminated as a multi-layer film.

When the photocurable resin material has a very low viscosity, it is possible to effect a pattern transfer by sufficiently decreasing a pressure of the mold to be applied to the photocurable resin material, although a degree of the pattern transfer varies depending on the viscosity of the photocurable resin material.

Figure 3:
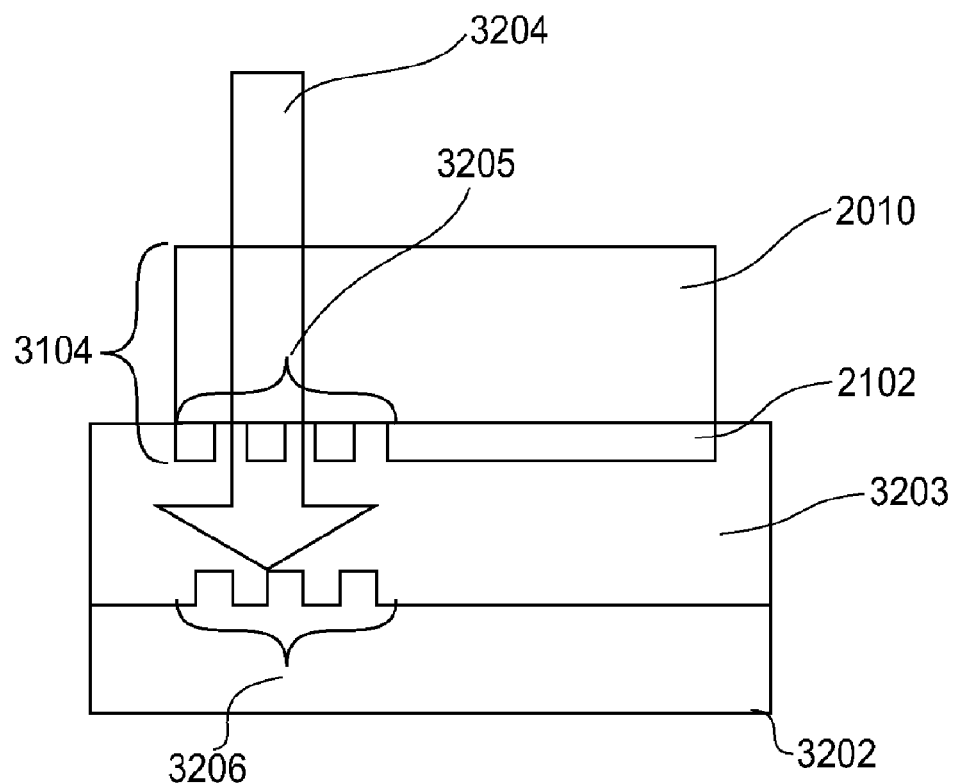
FIG. 3 is a schematic sectional view for illustrating alignment of a mold with a work in an embodiment of the present invention.

Next, alignment of the mold with the member to be processed (work) will be described. FIG. 3 is a schematic sectional view for illustrating the alignment of the mold, which is any one of the molds shown in FIGS. 2(a) to 2(h), with the work (member to be processed).

For example, as shown in FIG. 3, a mold 3104 is prepared. A photocurable resin material 3203 is applied onto a work 3202. In other words, the photocurable resin material 3203 is filled between the mold 3104 and the work 3202. In FIG. 3, the mold 3104 is provided with an alignment structure (alignment mark) 3205. A surface layer 2102 may be formed on a mold substrate 2010 as shown in FIG. 3 or formed inside the mold substrate 2010. The work 3202 is provided with an alignment structure 3206.

In this example, a material for the surface layer 2102 has a refractive index larger than 1.7. In the above-described constitution, the alignment is performed by using light in a wavelength range in which the photocurable resin material 3203 is not cured as detection light 3204. The surface layer 2102 and the photocurable resin material 3203 have different refractive indices, so that it is possible to observe the alignment structure 3205.

More specifically, the surface layer 2102 is constituted so as to have the refractive index larger than 1.7, whereby a refractive index difference between the surface layer 2102 and the photocurable resin material 3203 can be ensured. In other words, the above-described alignment structure 3205 can be clearly observed.

The detection light 3204 passes through the mold substrate 2010 and the surface layer 2102, so that it is also possible to observe the alignment structure 3206 on the substrate 3202 at the same time.

Thus, according to the above-described constitution of this embodiment, even when the mold and the work are brought close to each other to be placed in such a state that the photocurable resin material is filled between the mold and the work, i.e., both the mold and the work contact the photocurable resin material, it is possible to effect a high-accuracy alignment.

In order to effect the accurate alignment in an optical imprint technology by irradiation with ultraviolet light, it is preferable that the alignment be carried out in such a state that the mold and the work are close to each other. In this case, however, the photocurable resin material is filled between the mold and the work, creating a problem in that the alignment structure is less observable in such a state.

However, as described above, by using the mold having the alignment structure constituted by the high refractive index material according to this embodiment, it is possible to detect the alignment structure (alignment mark) with visible light even in the photocurable resin material while ensuring a high contrast. As a result, it is possible to perform a highly accurate alignment.

Hereinafter, the present invention will be described more specifically based on specific embodiments.

Embodiment 1

Mold of FIG. 2(a)

Figure 4:
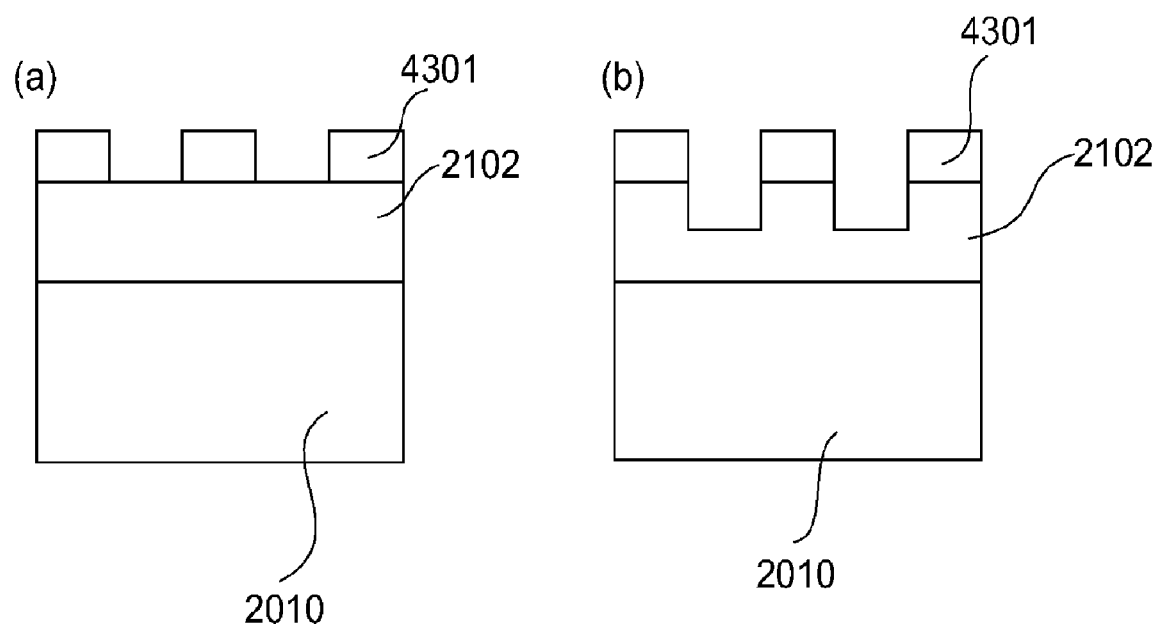
FIGS. 4(a) and 4(b), FIGS. 5(a) to 5(c), FIGS. 6(a) to 6(f), FIGS. 7(a) to 7(f), FIGS. 8(a) to 8(h), and FIGS. 9(a) to 9(e) are schematic sectional views for illustrating a mold production process according to the present invention.

In this embodiment, a mold production process that utilizes etching according to the present invention will be described. FIGS. 4(a) and 4(b) are schematic sectional views for illustrating an example of the preparation steps of the mold in this embodiment.

(1) First, a mask layer 4301 is formed on a surface layer 2102 of a mold substrate 2010 (FIG. 4(a)). The mask layer 4301 may be a layer of a resist mask or a layer of a hard mask of a metal material, such as Cr, Al, or WSi.
(2) Next, the surface layer 2102 is etched using the mask layer 4301 as a mask (FIG. 4(b)).
(3) After the etching, the mask layer 4301 is removed.

Here, by stopping the etching at an intermediary portion of the surface layer 2102, it is possible to form the mold shown in FIG. 2(a).

Further, by stopping the etching at a boundary (interface) between the mold substrate 2010 and the surface layer 2102, it is possible to form the mold shown in FIG. 2(b).

Further, by continuing the etching until a certain amount of the mold substrate 2010 is removed, it is possible to form the mold shown in FIG. 2(c).

Further, the mold substrate itself is formed of the material for the surface layer 2102, whereby it is possible to prepare the mold 2108 shown in FIG. 2(e).

Embodiment 2

Mold of FIG. 2(b)

Figure 5:
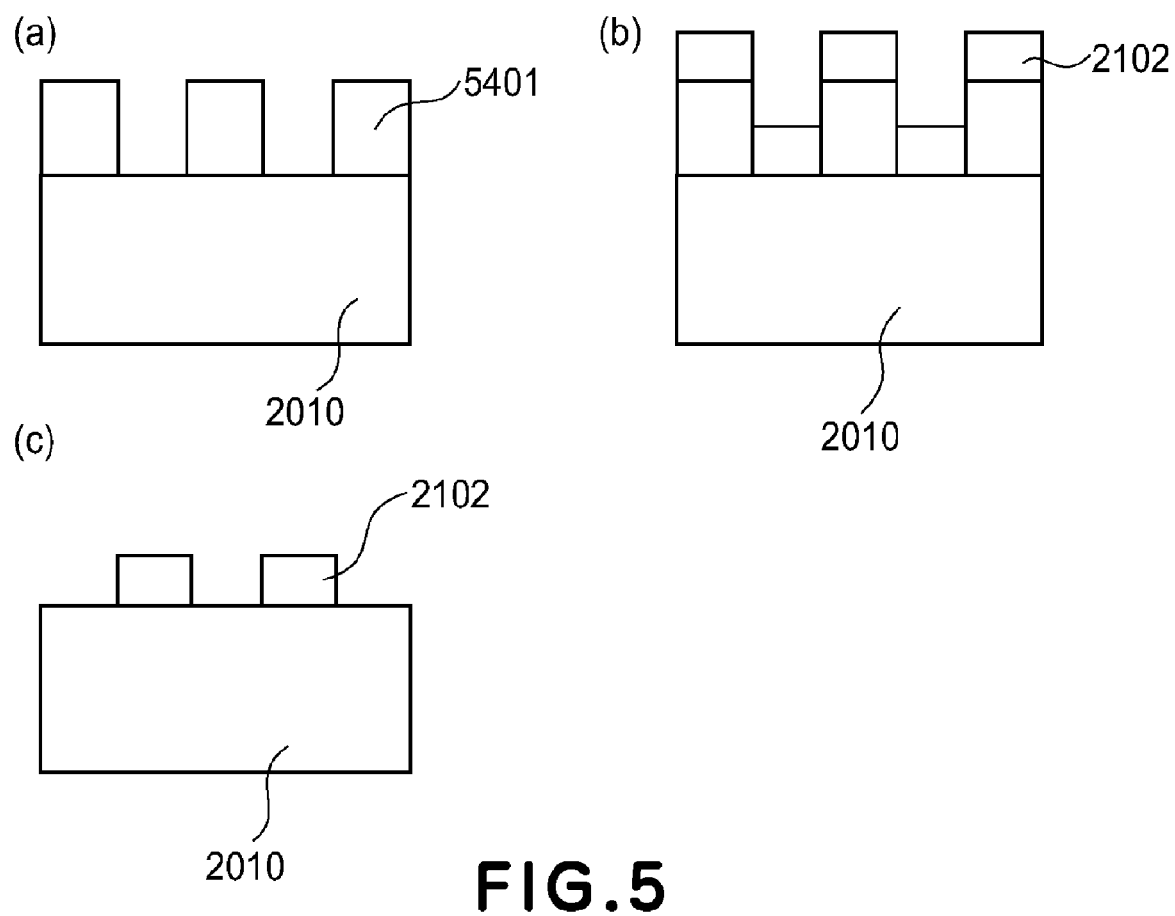

In this embodiment, a mold production process according to the present invention by the lift-off method will be described. FIGS. 5(a) to 5(c) are schematic sectional views for illustrating an example of the preparation steps of the mold in this embodiment.

(1) First, a mask layer 5401 of the resist is formed on a surface of a mold substrate 2010 (FIG. 5(a)).
(2) Next, a surface layer 2102 is formed of a material on the entire surface to the mask layer 5401 (FIG. 6(b)).
(3) Next, the mask layer 5401 is removed by the lift-off method to form a pattern 2102 (FIG. 5(c)).

The mold shown in FIG. 5(c) corresponds to the mold shown in FIG. 2(b). However, it is also possible to form the mold 2103 by forming the surface layer 2102 on the entire surface of the mold substrate 2010 before the mask layer 5401 is formed. Further, it is also possible to form the mold 2108 by using the material for the surface layer 2102 as that for the mold substrate.

Further, by using the surface layer 2102 formed by the lift-off method as a mask, the mold substrate 2010 is subjected to etching to prepare the mold 2105. In this case, however, it is necessary to select a combination of materials and an etching condition, which are capable of ensuring a sufficient etching selection ratio.

Embodiment 3

In this embodiment, a production process of a mold, according to the present invention, for adjusting a depth (height) corresponding to a stepped portion in an actual pattern area and an alignment structure area will be described. A contact for permitting the observation of the alignment structure basically depends on a stepped portion formed at the surface layer 2102 (constituted by the second material). Accordingly, with respect to the molds 2104 and 2105, the surface layer 2102 is only required to be formed, as a film, at a thickness designed to permit a contrast.

On the other hand, in the cases of the molds 2103 and 2108, the stepped portion formed at the surface layer 2102 does not necessarily have a depth suitable for the imprint process. In this case, it is necessary to change the depth of the stepped portion between the actual pattern area and the alignment structure area. A process for realizing such a constitution is shown in FIGS. 6(a) to 6(f).

Figure 6:
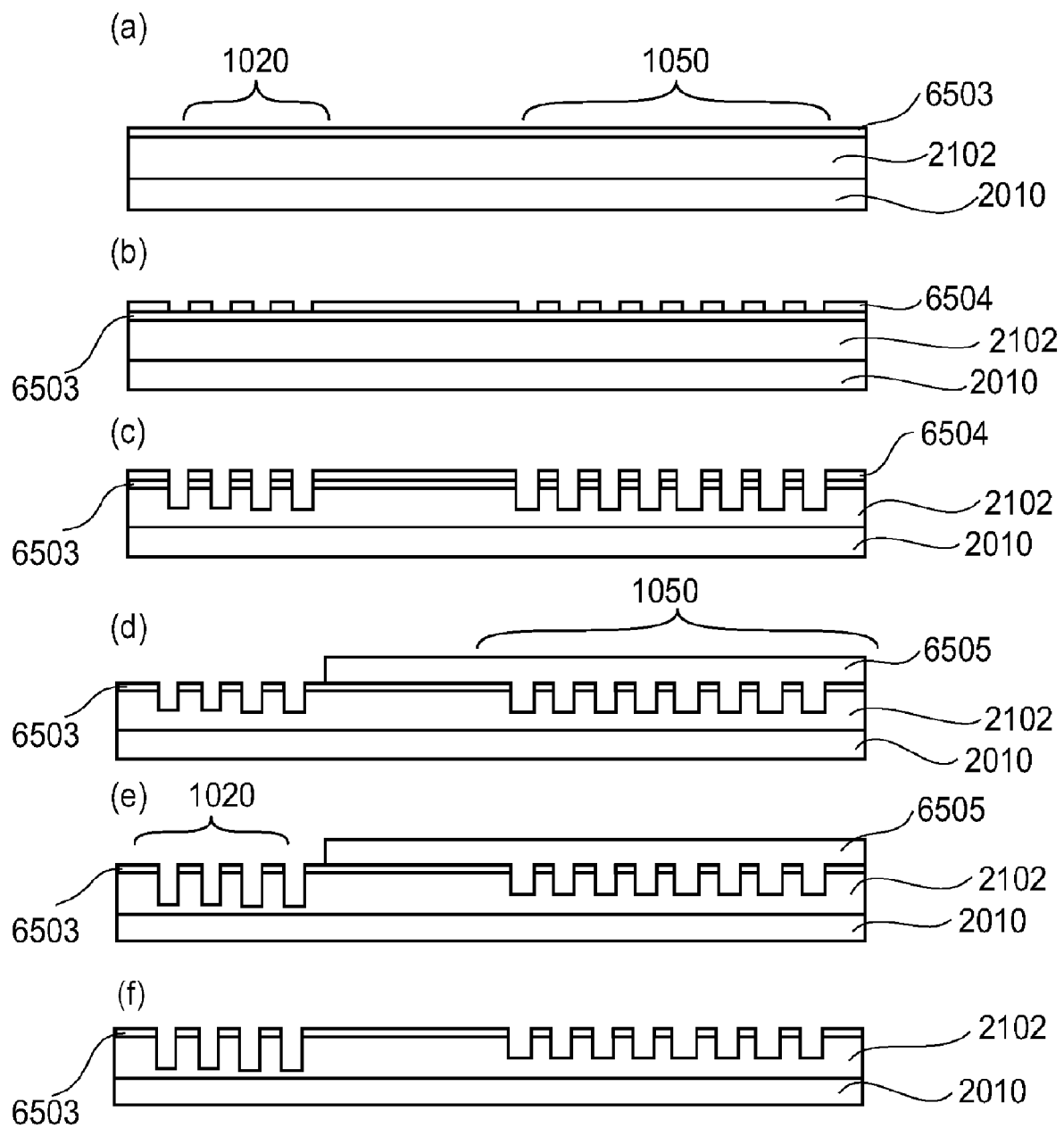
Figure 7:
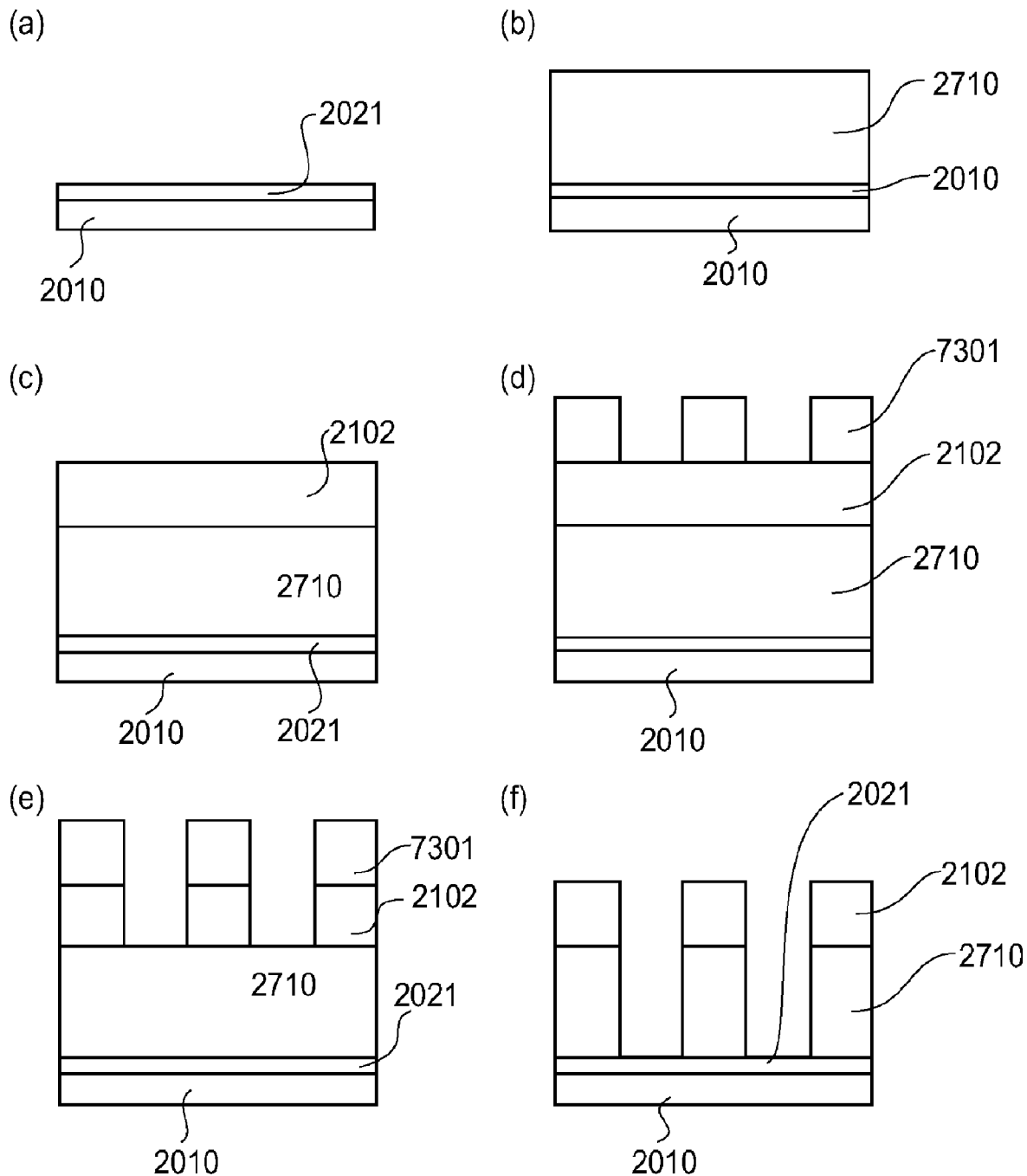

(1) First, a hard mask layer 6503 is formed of, e.g., Al, Cr or WSi on a surface layer 2102 of a mold substrate 2010 (FIG. 6(a)).
(2) Next, a resist 6504 is disposed on the hard mask layer 6503 and subjected to patterning (FIG. 6(b)).
(3) Then, the hard mask layer 6503 is subjected to etching and in succession, the surface layer 2102 is subjected to etching. During the etching of the surface layer 2102, the resist 6504 may be left as it or may be removed and subjected to etching with use of the hard mask layer 6503 as a mask. In either case, the resultant structure is finally placed in such a state that the resist 6504 is removed (FIG. 6(c)).
(4) Next, a resist 6505 is subjected to patterning so as to cover the actual pattern area 1050 (FIG. 6(d)).
(5) Then, additional etching using the hard mask layer 6503 as a mask is effected in the alignment area 1020 (FIG. 6(e)).
(6) Thereafter, the resist 6505 is removed (FIG. 6(f)).

By the above-described process, it is possible to prepare such a mold that a depth of a recess of the alignment structure (alignment mark) is greater than a depth of a recess of the actual pattern.

On the other hand, in the case where the depth of the recess of the alignment structure is less than the depth of the recess of the actual pattern, the patterning of the resist 6505 may be effected to cover the alignment structure.

In the above-described manner, it is possible to appropriately and selectively prepare the molds including the actual pattern and the alignment structure, which have optimum recesses. After the above-described step (6), it is also possible to prepare a mold for imprint by appropriately removing the hard mask layer 6503.

As described above, the mold according to this embodiment is realized. More specifically, it is possible to produce a mold that both the alignment mark area 1020 and the imprint pattern area 1050 are constituted by including the recess so that a depth of the recess in the alignment mark area is greater than a depth of the recess in the imprint pattern area.

Further, in this embodiment, it is also possible to prepare a mold by removing the mold substrate 2010 after the step (6) (FIG. 6(f)) or omitting the mold substrate 2010 from the step (1) (FIG. 6(a)), so long as the resultant mold itself can ensure sufficient strength.

Embodiment 4

Mold of FIG. 2(h)

FIGS. 7(a) to 7(f) show a production process of the mold shown in FIG. 2(h).
(1) A layer 2021 is formed of a high refractive index material on a surface of a mold substrate 2010 (FIG. 7(a)).
(2) On the layer 2021, a layer 2710 is formed of a mold identical to or close in refractive index to the material for the mold substrate 2010 (FIG. 7(b)).
(3) On the layer 2710, a layer 2102 is formed of a material identical to or close in refractive index to the material for the layer 2021 (FIG. 7(c)).
(4) On the surface of the layer 2102, a mask layer 7301 is formed (FIG. 7(d)).
(5) The layer 2102 is etched using the mask layer 7301 (FIG. 7(e)), and then the layer 2710 is etched.

During the etching of the layer 2710, the mask layer 7301 may be left as it is, or it may be removed and etched using the layer 2102 as a mask layer. In either case, the mask layer 7301 is removed in the resultant structure (FIG. 7(f)).

Embodiment 5

Mold of FIG. 2(g)

FIGS. 8(a) to 8(h) show a production process of the mold shown in FIG. 2(g).
(1) A layer 2021 is formed of a high refractive index material on a surface of a mold substrate 2010 (FIG. 8(a)).
(2) On the substrate of the layer 2021, a mask layer 8301 is formed (FIG. 8(b)).
(3) The layer 2021 is etched using the mask layer 8301 as a mask (FIG. 8(c)).
(4) After removing the mask layer 8301, on the layer 2021, a layer 2710 is formed of a mold identical to or close in refractive index to the material for the mold substrate 2010 (FIG. 8(d)).
(5) On the layer 2710, a layer 2102 is formed of a material identical to or close in refractive index to the material for the layer 2021 (FIG. 8(e)).
(6) On the surface of the layer 2102, a mask layer 8302 is formed (FIG. 8(f)).
(7) The layer 2102 is etched using the mask layer 8301 (FIG. 8(g)), and then the layer 2710 is etched.

During the etching of the layer 2710, the mask layer 8302 may be left as it is, or it may be removed and etched using the layer 2102 as a mask layer. In either case, the mask layer 8302 is removed in the resultant structure (FIG. 7(f)).

Embodiment 6

Mold of FIG. 2(f)

FIGS. 9(a) to 9(e) show a production process of the mold shown in FIG. 2(f).
(1) On a surface of a mold substrate 2010, a mask layer 9301 is formed (FIG. 9(a)).
(2) The mold substrate 2010 is etched using the mask layer 9301 (FIG. 9(b)). It is also possible to dispose a hard mask layer between the mold substrate 2010 and the mask layer 9301.
(3) A layer 2102 is formed of a high refractive index material on the surface of the mold substrate 2010 (FIG. 9(c)).
(4) The layer 2102 is etched and partially removed by, e.g., a processing method, such as chemical mechanical polishing (CMP), so as to have the same surface level as the surface of the mold substrate 2010 (FIG. 9(d)).
(5) The layer 2102 is further removed by etching or the like, so as to have a thickness such that the upper surface of the layer 2102 is located at an arbitrary intermediary portion between the upper surface of the mold substrate 2010 and the bottom of the recess provided to the mold substrate 2010 (FIG. 9(e)).

While the invention has been described with reference to the structures disclosed herein, it is not confined to the details set forth, and this application is intended to cover such modifications or changes as may come within the purpose of the improvements or the scope of the following claims.

This application claims priority from Japanese Patent Applications Nos. 258034/2005 filed Sep. 6, 2005 and 194905/2006 filed Jul. 14, 2006, which are hereby incorporated by reference.

What is claimed is:

1. A process for producing a chip, the process comprising:
preparing a mold and a member to be processed, on which a photocurable resin material is disposed;
forming a pattern on the photocurable resin material with the mold; and
etching an area contacting a layer, in which the pattern is formed, by using the pattern as a mask,
wherein the mold comprises:
a substrate comprising a first material; and
an alignment mark, disposed on the substrate, comprising a second material different from the first material,
wherein the first material and the second material transmit at least light in a part of wavelength range of ultraviolet light, and
wherein the second material has a refractive index, with respect to visible light having a wavelength of 633 nm, of not less than 1.7.

2. A process for producing a chip, the process comprising:
preparing a mold and a member to be processed, on which a photocurable resin material is disposed;
forming a pattern on the photocurable resin material with the mold; and
etching an area contacting a layer, in which the pattern is formed, by using the pattern as a mask,
wherein the mold comprises:
a substrate comprising a first material; and
an alignment mark, disposed on the substrate, comprising a second material different from the first material,
wherein the first material and the second material are transparent to visible light and also to light in a part of a wavelength range of ultraviolet light, and
wherein the second material has a refractive index, with respect to visible light having a wavelength of 633 nm, of not less than 1.7.

3. A process for producing a chip, the process comprising:
preparing a mold and a member to be processed, on which a photocurable resin material is disposed;
forming a pattern on the photocurable resin material with the mold; and
etching an area contacting a layer, in which the pattern is formed, by using the pattern as a mask, wherein the mold comprises:
  a substrate comprising a first material;
  a plurality of projections comprising a first layer comprising a second material different from the first material; and
  a second layer, comprising the second material, disposed between the projections,
  wherein the first material and the second material are transparent to visible light and also to light in a part of a wavelength range of ultraviolet light,
  wherein the second material has a refractive index, with respect to visible light having a wavelength of 633 nm, of not less than 1.7, and
    wherein the first layer and the second layer have different thicknesses.

4. A process for producing a chip, the process comprising:
preparing a mold and a member to be processed, on which a photocurable resin material is disposed;
forming a pattern on the photocurable resin material with the mold; and
etching an area contacting a layer, in which the pattern is formed, by using the pattern as a mask,
wherein the mold comprises:
  a substrate comprising a first material; and
  a plurality of projections, which are disposed on the substrate, and comprise a first layer comprising a second material,
  wherein the first material and the second material are transparent to visible light and also to light in a part of a wavelength range of ultraviolet light,
  wherein the second material has a refractive index, with respect to visible light having a wavelength of 633 nm, of not less than 1.7, and
  wherein the second material is not disposed between the projections on the substrate.

5. A process for producing a chip, the process comprising:
preparing a mold and a member to be processed, on which a photocurable resin material is disposed;
forming a pattern on the photocurable resin material with the mold; and
etching an area contacting a layer, in which the pattern is formed, by using the pattern as a mask,
wherein the mold comprises:
  an alignment mark area; and
  an imprint pattern area,
  wherein in the alignment mark area, a material having refractive index, with respect to visible light having a wavelength of 633 nm, of not less than 1.7 is disposed, and
  wherein the material in the alignment mark area is transparent to visible light and also to light in a part of a wavelength range of ultraviolet light.

* * * * *